United States Patent
Shen et al.

(10) Patent No.: US 9,667,266 B1
(45) Date of Patent: May 30, 2017

(54) VDD-REFERENCED SAMPLING

(71) Applicant: Analog Devices, Inc., Norwood, MA (US)

(72) Inventors: Junhua Shen, Wilmington, MA (US); Michael C. W. Coln, Lexington, MA (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 15/048,526

(22) Filed: Feb. 19, 2016

(51) Int. Cl.
  *H03M 1/00* (2006.01)
  *H03M 1/12* (2006.01)
  *H03M 1/46* (2006.01)

(52) U.S. Cl.
  CPC ......... *H03M 1/1245* (2013.01); *H03M 1/468* (2013.01)

(58) Field of Classification Search
  CPC .... H03M 1/442; H03M 1/164; H03M 1/1215; H03M 1/1245; H03M 1/468
  USPC ........................................................ 341/122
  See application file for complete search history.

(56) References Cited

U.S. PATENT DOCUMENTS

| | | | |
|---|---|---|---|
| 6,667,707 B2 | 12/2003 | Mueck et al. | |
| 7,167,121 B2 * | 1/2007 | Carreau | H03M 1/1245 341/150 |
| 7,233,273 B2 | 6/2007 | Tachibana et al. | |
| 7,271,758 B2 | 9/2007 | Piasecki et al. | |
| 7,432,844 B2 | 10/2008 | Mueck et al. | |
| 7,589,659 B2 | 9/2009 | Hurrell | |
| 7,782,234 B2 | 8/2010 | Ahmad | |
| 7,821,441 B2 | 10/2010 | Westwick et al. | |
| 7,928,871 B2 | 4/2011 | Aruga et al. | |
| 8,344,931 B2 | 1/2013 | Zhu et al. | |
| 8,717,221 B2 | 5/2014 | Jeon et al. | |
| 8,922,275 B2 | 12/2014 | Thomas | |
| 8,994,568 B2 | 3/2015 | Nagarajan et al. | |

(Continued)

OTHER PUBLICATIONS

Fayomi, Christian J.B., et al., "Low Voltage CMOS Analog Bootstrapped Switch for Sample-and-Hold Circuit: Design and Chip Characterization", (2005), 2200-2203.

(Continued)

*Primary Examiner* — Lam T Mai
(74) *Attorney, Agent, or Firm* — Schwegman Lundberg & Woessner, P.A.

(57) ABSTRACT

A voltage sampling circuit is provided that may directly connect a non-zero power supply voltage VDD to switching circuits during input voltage sampling, setting a common mode voltage without using reference voltages produced by a reference voltage generator circuit, and without requiring a common mode buffer circuit. The voltage sampling circuit may be used in an operational amplifier input stage such as for a pipelined ADC circuit, or in a comparator circuit. A SAR ADC circuit is also provided, comprising a control circuit, the voltage sampling circuit, a capacitor array, and a comparator circuit for comparing outputs occurring from charge redistributions. The voltage sampling circuit may enable increased power efficiency, avoid leakage concerns, and increase maximum input voltage swing. Reference plate switches in the voltage sampling circuit may include gate-boosted devices or thicker-oxide I/O devices. The devices may include n-channel field-effect transistors or high threshold voltage p-channel field-effect transistors.

20 Claims, 8 Drawing Sheets

(56) References Cited

U.S. PATENT DOCUMENTS

2008/0169785 A1* 7/2008 Kim ................ H01M 10/4207
320/124
2012/0081244 A1* 4/2012 Lai ..................... H03M 1/1215
341/122

OTHER PUBLICATIONS

Hong, Hyeok-Ki, et al., "A 2.6b/cycle-Architecture-Based 10b 1.7GS/s 15.4mW 4x-Time-Interleaved SAR ADC with a Multistep Hardware-Retirement Technique", ISSCC 2015 / Session 26, (2015), 3 pgs.

Kapusta, Ron, et al., "A 14b 80 MS/s SAR ADC With 73.6 dB SNDR in 65 nm CMOS", IEEE Journal of Solid-State Circuits, vol. 48, No. 12, (Dec. 2013), 8 pgs.

Liu, Chun-Cheng, et al., "A 10b 100MS/s 1.13mW SAR ADC with Binary-Scaled Error Compensation", ISSCC 2010 / Session 21, (2010), 3 pgs.

* cited by examiner

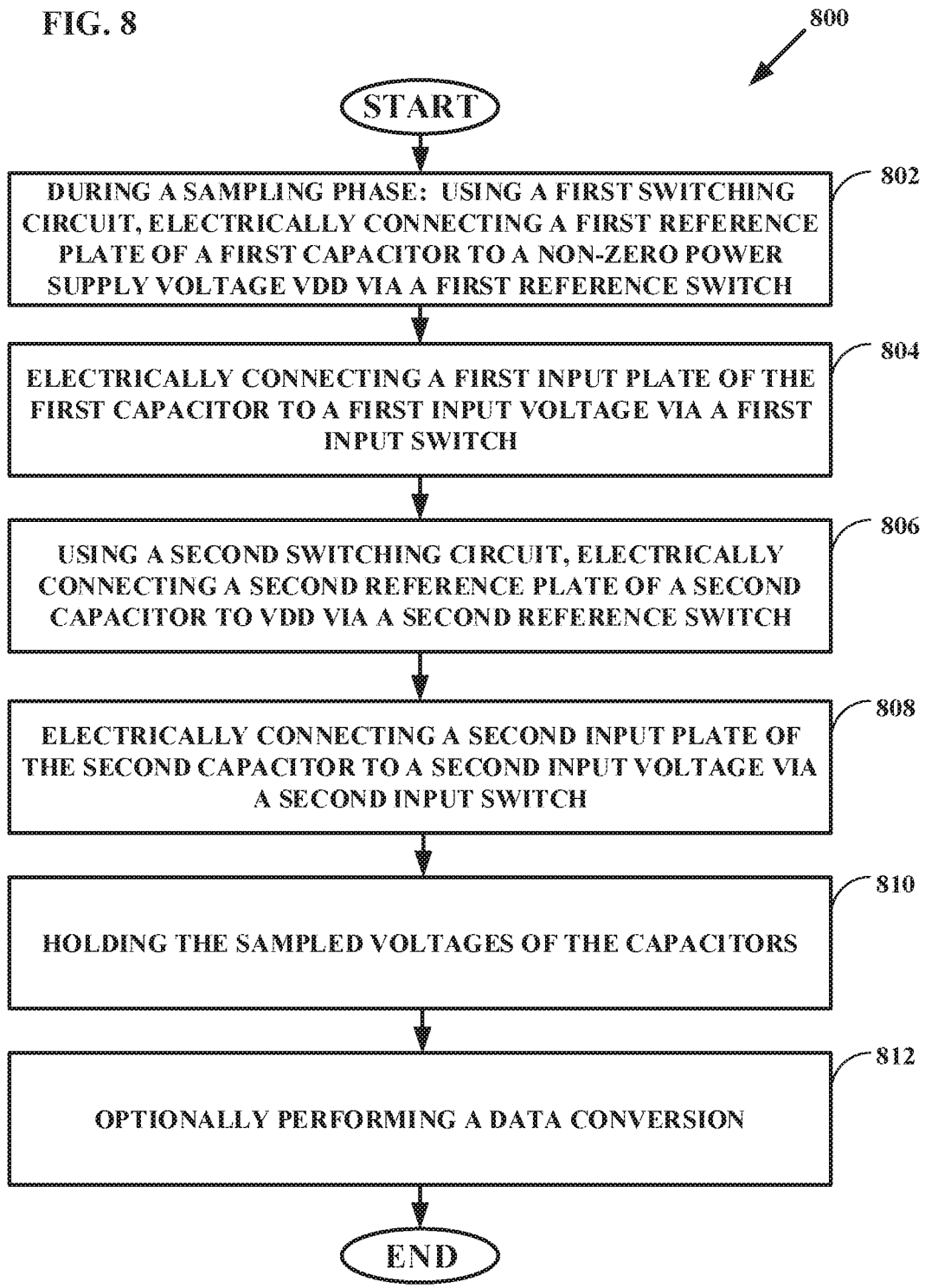

VDD-REFERENCED SAMPLING

TECHNICAL FIELD

The present disclosure relates to an improved voltage sampling circuit that may be particularly useful in analog-to-digital conversion.

BACKGROUND

Analog-to-digital converters (ADCs) are widely used, and are designed to sample and quantize input voltages via comparison against reference voltages. The reference voltages may each represent binary data values. Capacitors often serve as memory elements to hold the sampled input voltages to be processed. The successive approximation routine (SAR) ADC is one possible type of data converter, though others are possible, including pipelined ADCs. Commonly assigned U.S. Pat. No. 6,667,707B2, which describes a ground based voltage sampling approach for a SAR ADC, in which the reference plates of the sampling capacitors connect to ground during sampling, is hereby incorporated by reference in its entirety. Commonly assigned U.S. Pat. No. 7,167,121B2, which describes split reference voltage sampling to generate a reference voltage between positive supply voltage TVDD and ground for a SAR ADC, is hereby incorporated by reference in its entirety.

OVERVIEW

The present inventors have recognized, among other things, that particular improvements of the voltage sampling circuitry used for example in analog-to-digital converters are possible. This document describes a SAR ADC sampling circuit that uses a non-zero power supply voltage VDD as a common mode voltage for voltage sampling. This approach may improve power efficiency, such as over an approach of producing a common mode voltage with continuously operated common mode voltage generator circuitry.

Such a sampling circuit design approach may enable multiple further advantages. For example, it may reduce or eliminate the leakage concerns of the ground based sampling approach, such that no common mode boosting circuitry may be required. This approach may also allow larger available voltage swings, e.g., VDD±VDD, instead of VDD/2±VDD/2, thus potentially doubling the ADC input voltage range. Since VDD may be readily available in the circuit, just like ground, ADCs designed as described herein may also be well suited for passive sampling and thus ultra-low power applications.

In an example, an integrated circuit for sampling voltages may include a number of switching circuits that each, during a sampling phase, may electrically connect a reference plate of a capacitor to a non-zero power supply voltage VDD via a reference switch and electrically connect an input plate of the capacitor to an input voltage via an input switch. During a holding phase, the switching circuits may hold the voltages sampled on each capacitor.

In an example, a voltage sampling method may include, using each of a number of switching circuits, during a sampling phase, electrically connecting a reference plate of a capacitor to a non-zero power supply voltage VDD via a reference switch and electrically connecting an input plate of the capacitor to an input voltage via an input switch. During a holding phase, the switching circuits may hold the voltages sampled on each capacitor.

In an example, a system may include means for sampling and holding a number of input voltages, each measured with respect to a non-zero power supply common mode voltage VDD, and means for performing an analog-to-digital data conversion of at least one of (a) one of the input voltages and (b) a difference between two of the input voltages.

This overview is intended to provide an overview of subject matter of the present patent application. It is not intended to provide an exclusive or exhaustive explanation of the invention. The detailed description is included to provide further information about the present patent application.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

FIG. 8 shows a flowchart of a voltage sampling method 800, such as for analog-to-digital conversion.

DETAILED DESCRIPTION

Figure 1:
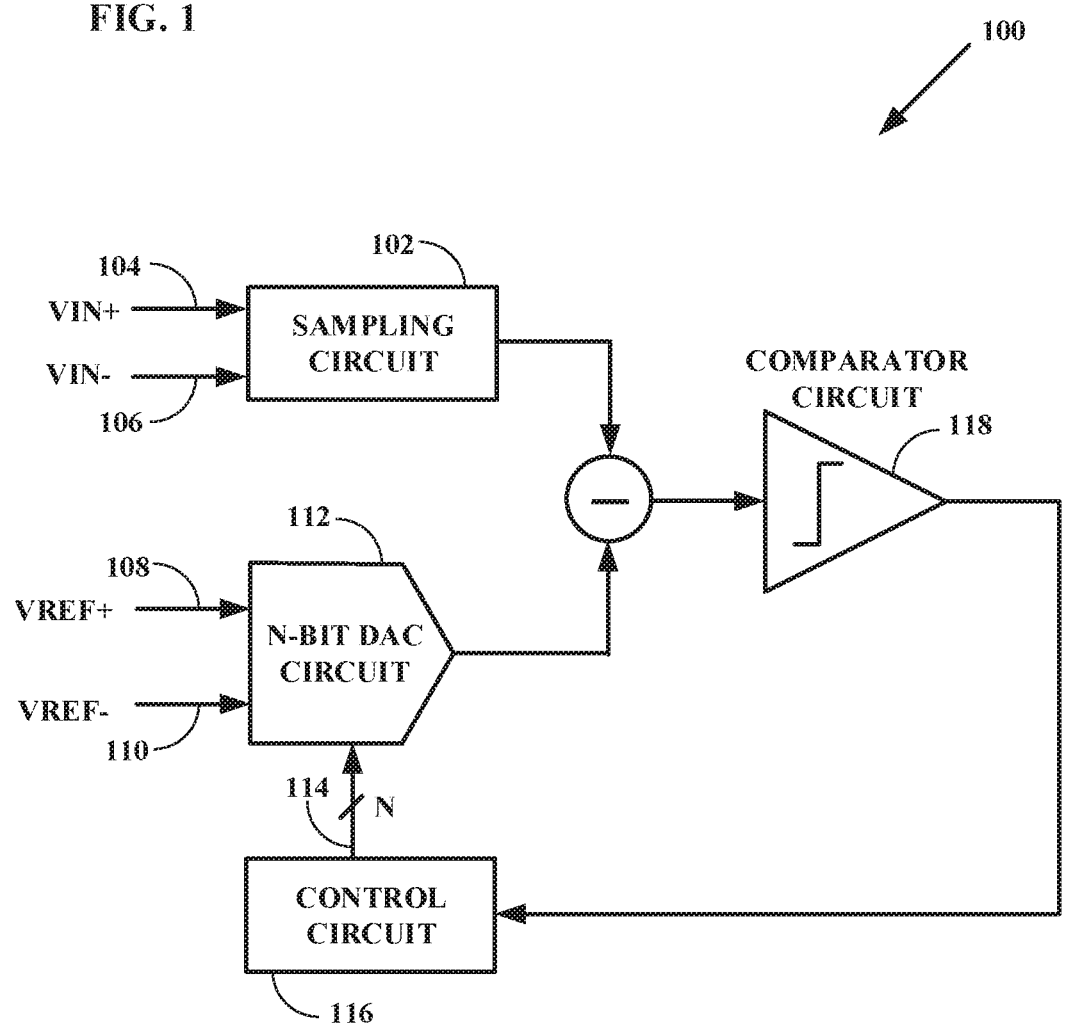
FIG. 1 shows a functional block diagram of an example of a SAR ADC 100.

FIG. 1 shows a functional block diagram of an example of a SAR ADC 100. A sampling circuit 102 may sample input voltages at nodes 104 and 106 during a sampling phase, and hold these voltages during a holding phase, until a subsequent conversion phase. During the conversion phase, a comparator circuit 118 may sequentially perform various weighted comparisons of the input voltages at nodes 104 and 106 and reference voltages at nodes 108 and 110, such as can be generated by a digital-to-analog converter (DAC) 112, such as based on one or more control signals 114 from a control circuit 116. The control circuit 116 may include successive approximation logic that iteratively adjusts the output of the DAC 112 to best match the sampled differential input voltage, within a given resolution, thus completing a discrete-time negative feedback loop SAR ADCs may perform a binary search that can resolve a single bit per comparator circuit 118 decision. The control circuit 116 may receive each comparator circuit 118 decision and responsively update the control signals 114 applied to the DAC 112.

Figure 2:
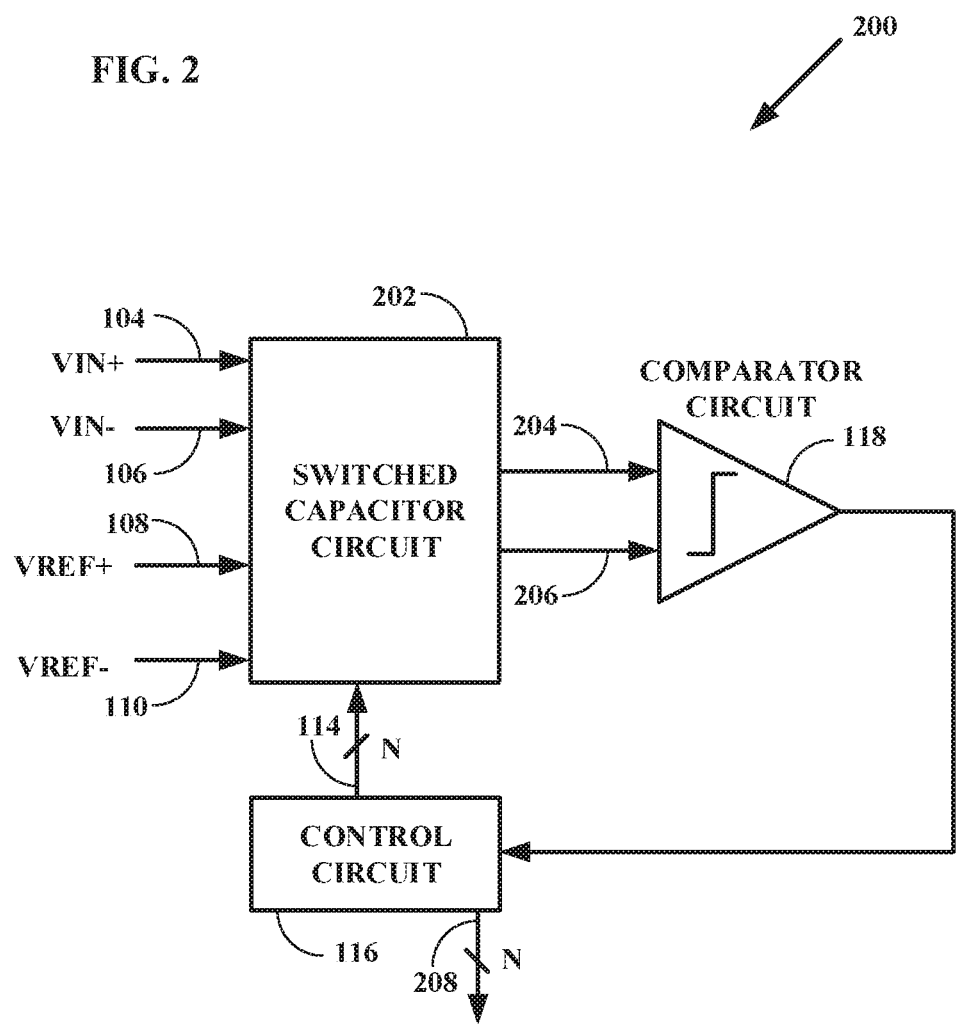
FIG. 2 shows a functional block diagram of an example of a differential input switched capacitor based SAR ADC 200.

FIG. 2 shows a functional block diagram of an exemplary differential input switched capacitor based SAR ADC 200. A switched capacitor circuit 202 may perform the sampling and DAC functions shown in FIG. 1. After the sampling phase, the switched capacitor circuit 202 may switch members of a binary-weighted array of capacitors together to redistribute stored charges. The voltages at nodes 204 and 206 arising from the various charge redistributions within the switched capacitor circuit 202 may be provided to the comparator circuit 118. The comparator circuit 118 may perform a sequence of bitwise trials that iteratively manage the DAC functionality such as previously described. The control circuit 116 may also provide a digital output signal 208, which corresponds to the last-used digital word, e.g., the value of the bits to which the capacitors were connected, which, after completing the SAR, provides a digital signal value converted from the analog input signal value.

Figure 3:
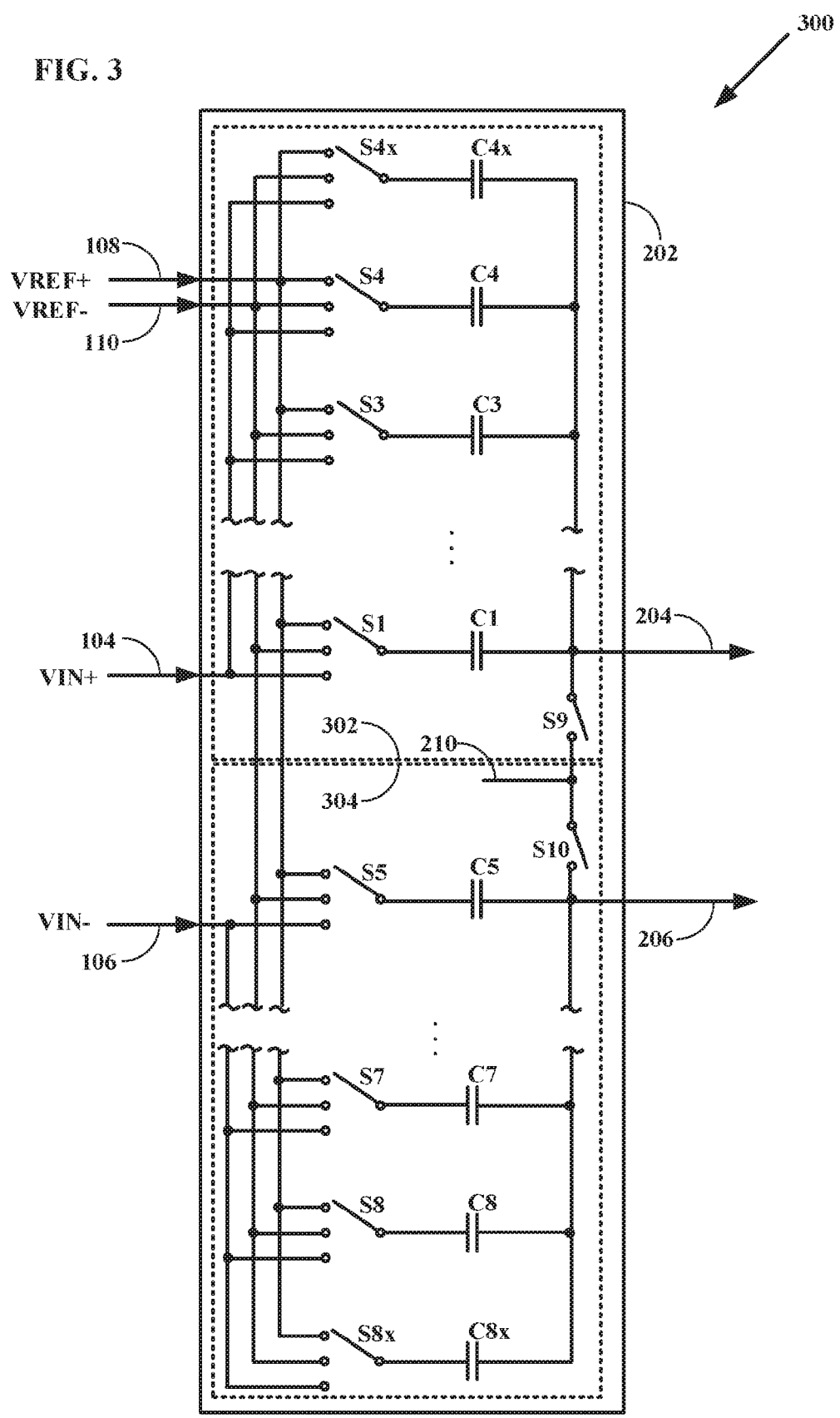
FIG. 3 shows an example of a switched capacitor circuit implementation 202, such as for analog-to-digital conversion.

FIG. 3 shows an example of a switched capacitor circuit 202 implementation such as for analog-to-digital conversion. For illustrative clarity, a switched capacitor circuit 202 for a 4-bit ADC is shown. A first switching circuit 302 may include capacitors C1-C4$x$ and switches S1-S4$x$ and S9, for performing a digital-to-analog conversion of for example the most significant bits of a DAC value specified by the control signals 114. Capacitors C1-C4 may have binary-weighted capacitance values C/2, C/4, C/8, and C/16, respectively. Capacitor C4$x$ may have the same capacitance as C4, namely C/16, so that the sum of capacitances C2-C4$x$ equals the capacitance of C1. A similar second switching circuit 304 may include capacitors C5-C8$x$ and switches S5-S8$x$ and S10, for performing a digital-to-analog conversion of for example the least significant bits of a DAC value specified by the control signals 114. Capacitors C5-C8 may have binary-weighted capacitance values C/2, C/4, C/8, and C/16, respectively Capacitor C8$x$ may have the same capacitance as C8, namely C/16, so that the sum of capacitances C6-C8$x$ equals the capacitance of C5. Switches S1-S10 may be controlled by the control signals 114 provided by the control circuit 116.

During the sampling phase, switch S9 may be closed and switches S1-S4 may connect each of the capacitors C1-C4$x$ to sample input voltage at node 104 with respect to the common mode voltage at node 210. Switch S10 may also be closed and switches S5-S8 may connect each of the capacitors C5-C8$x$ to sample the input voltage at node 106 with respect to the common mode voltage at node 210. At the end of the sampling phase, switches S9 and S10 may be opened. During a subsequent conversion phase, the control circuit 116 may set switches S1-S4$x$ and S5-S8$x$ to various states based on a data conversion algorithm, and monitor the signals provided by the comparator circuit 118.

Comparator circuit 118 may operate best within a given input voltage range. ADCs therefore may include circuitry to generate a specific common mode voltage at node 210 during the sampling phase, around which individual comparisons are made during the comparison phase. The common mode voltage at node 210 may be set to an arbitrary but constant value, such as in this example for both comparator circuit 118 inputs, during sampling. The common mode voltage at node 210 may be set halfway between power supply voltages VSS and VDD such as to increase or maximize comparator circuit 118 input signal swing. ADCs may also use common mode buffer circuitry such as can help drive the reference plate of each sampling capacitor to its corresponding reference voltage during sampling, while the input plate of the sampling capacitor connects to an input voltage.

The continuous power consumption by reference voltage generator circuitry and common mode buffer circuitry may be a disadvantage limiting wider use of ADCs in the industry. The total power dissipation in a SAR type ADC may be dominated by the reference voltage generator circuitry, especially when the ADC is powered down most of the time while the input circuit keeps track of the input signals. In contrast, the power consumed by the comparator circuit and the switching circuits, when active, may be only a small fraction of the total power used.

In one approach, split reference sampling may generate a reference voltage between VDD and ground during sampling. This approach may not require common mode generator circuitry nor common mode buffer circuitry, and thus may reduce power consumption. However, this approach may involve additional circuit complexity.

In another approach, ground based sampling, circuitry may connect the reference plates of the sampling capacitors to ground during sampling. This approach also may not require common mode voltage generator circuitry nor common mode buffer circuitry, and thus may reduce power consumption. However, this approach may involve additional circuit complexity for boosting up the common mode voltage for at least part of the ADC operation. The boosting may be needed to avoid transistor leakage when the reference plate voltages of the sampling capacitors swing below ground.

The split reference sampling and ground based sampling approaches described may each be suitable for passive sampling, so that the ADC may be completely shut down to save power while the sampling circuit tracks the input voltages. Passive sampling may be important for achieving ultra-low power dissipation for many ADC applications. However, both these existing approaches may also have potentially limited voltage swing at the reference plates of the sampling capacitors.

Figure 4:
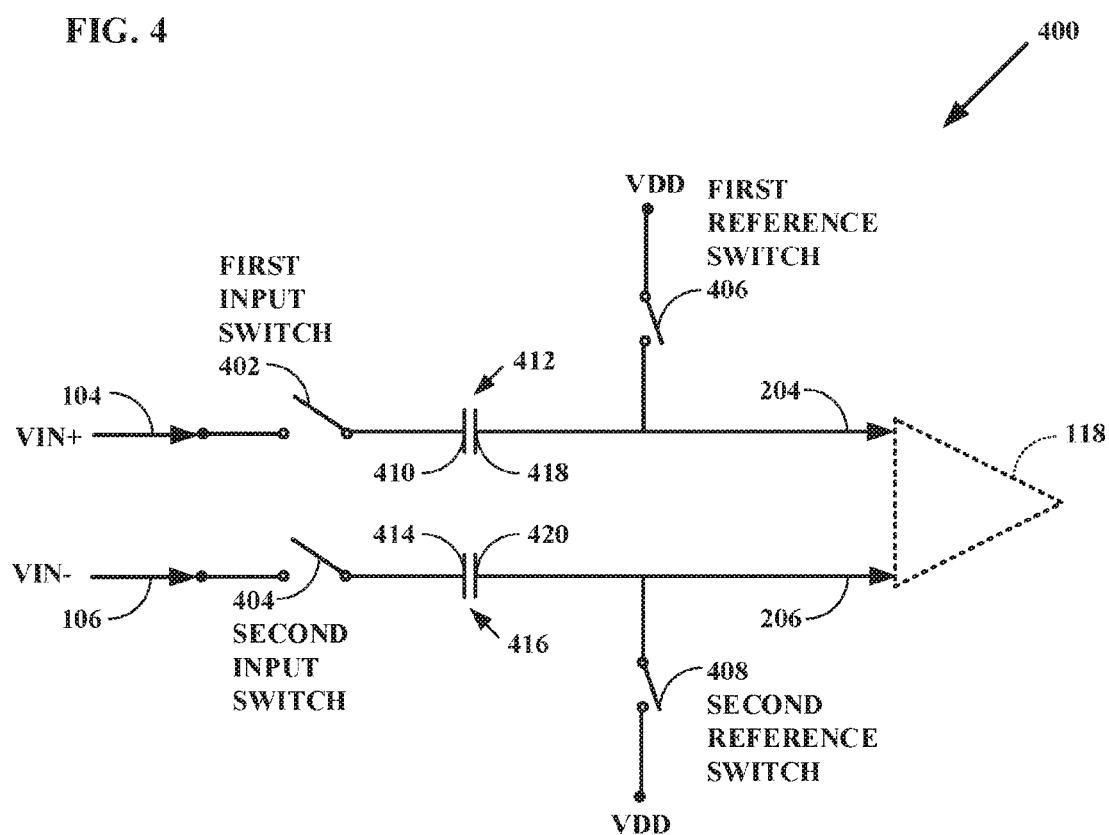
FIG. 4 shows an example of a voltage sampling circuit 400 with VDD) as the sampling common mode voltage, such as for analog-to-digital conversion.

FIG. 4 shows an example of a voltage sampling circuit 400 with a power supply voltage, VDD, as the sampling common mode voltage, such as for analog-to-digital conversion. During the sampling phase, a first input switch 402, a second input switch 404, a first reference switch 406, and a second reference switch 408 are all closed. A first input plate 410 of a first capacitor 412 may therefore be charged to the input voltage at node 104, and a second input plate 414 of a second capacitor 416 may therefore be charged to input voltage at node 106. A first reference plate 418 of the first capacitor 412 may therefore be charged to VDD, and a second reference plate 420 of the second capacitor 416 may also be charged to VDD. The comparator circuit 118 (or other similarly electrically connected circuit) may receive from the voltage sampling circuit 400 as its inputs the voltages at nodes 204 and 206, which may each be equal to VDD during sampling, so the common mode voltage at node 210 can also be equal to VDD).

The voltage sampling circuit 400 may include a subset of the example of the switched capacitor circuit 202 of the example of the differential input switched capacitor based SAR ADC 200 such as shown in FIG. 3, with its upper half comprising the first switching circuit 302 and its lower half comprising the second switching circuit 304. In other words, in FIG. 4 only a single capacitor is shown in each of the switching circuits for clarity, however, multiple capacitors can be substituted. Also, the voltage sampling circuit 400 may also serve in other applications. For example, the voltage sampling circuit 400 may serve as an input stage to an operational amplifier circuit. Such an operational amplifier circuit may for example serve as the input to a pipelined ADC circuit. In an example, the voltage sampling circuit 400 may serve as an input stage to a comparator circuit 118 that may by itself serve in other applications.

During a holding phase, the first input switch 402, the second input switch 404, the first reference switch 406, and the second reference switch 408 are all opened. Consequently, the various voltages on the various plates of the capacitors shown may all be held during the holding phase, such as for subsequent processing, such as in a conversion phase, such as previously described. Such subsequent processing may include charge redistribution in a SAR ADC circuit due to switch reconfiguration, such as previously described, but other examples are possible.

During the conversion phase, the voltages at nodes 204 and 206 may swing above VDD. Such excursions beyond supply voltages occur, and may cause leakage currents in or even damage to field-effect devices used for integrated circuitry for signal processing. These undesirable consequences may affect the transistors used as switches in the voltage sampling circuit 400 as well as the transistors used in the input stages of connected circuits, such as the comparator circuit 118 or the operational amplifier circuit previously described. This document now presents specific examples of solutions, each applicable to a SAR ADC, a comparator circuit 118, or the operational amplifier circuit previously described, and other circuit design applications.

Figure 5:
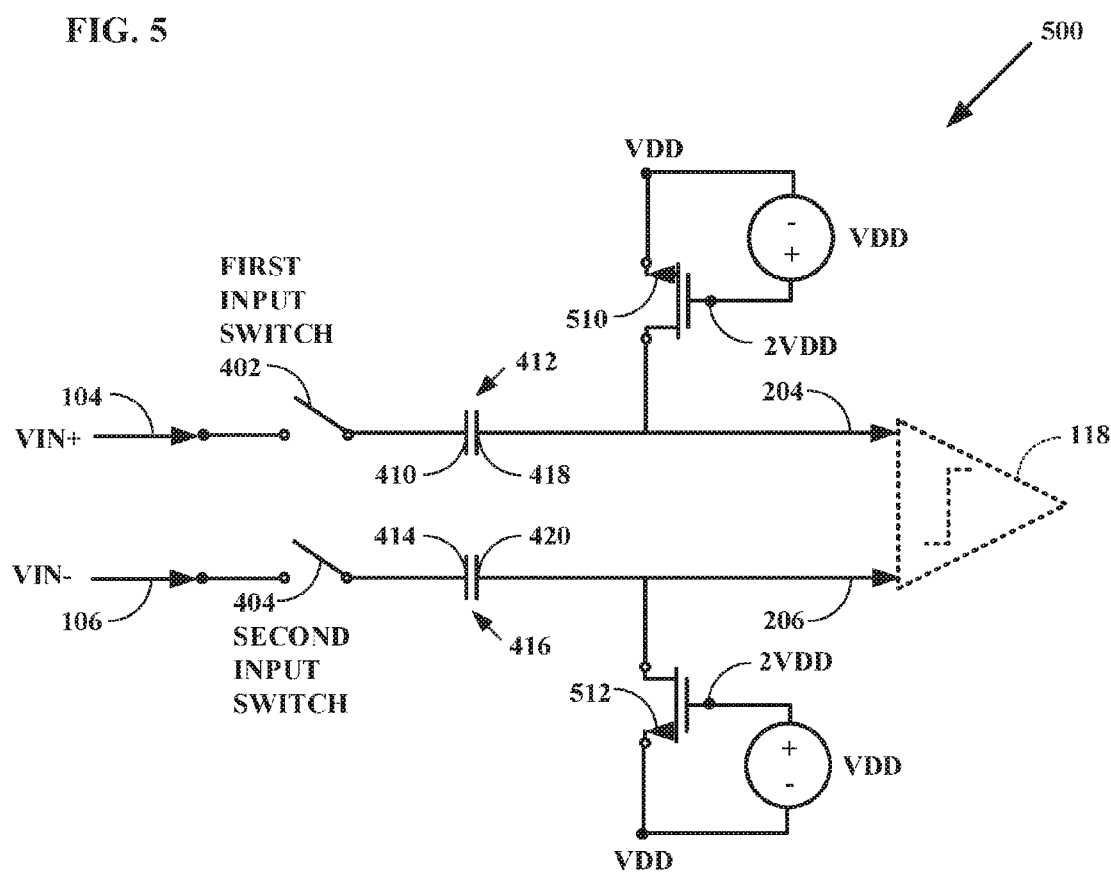
FIG. 5 shows an example of a voltage sampling circuit 500 with gate-boosted reference plate switches, such as for analog-to-digital conversion.

FIG. 5 shows an example of a voltage sampling circuit 500 with gate-boosted reference plate switches, such as for analog-to-digital conversion. The first reference switch 406 and the second reference switch 408 of FIG. 4 need not be implemented with regular n-channel field-effect transistors alone due to the potential for transistor leakage currents or damage. Instead, a clock booster circuit may boost non-zero supply voltage VDD to, for example, a boosted voltage value of 2*VDD, for application to switching transistor gate terminals. The extra VDD) generated for example, relative to switching transistor source terminals, is depicted as an effective voltage source between the gate and source of each n-channel field-effect transistor 510 and 512 for clarity. Each reference switch 406 and 408 of FIG. 4 may thus include an n-channel field-effect transistor (e.g., 510 and 512) that each receives a boosted voltage as its gate terminal voltage from the clock booster circuit, and VDD as its source terminal voltage. This allows the reference plates 418 and 420 of the capacitors to potentially swing up to positive and negative VDD around the VDD common mode voltage, when the gate voltage is 2*VDD, without significant leakage.

Figure 6:
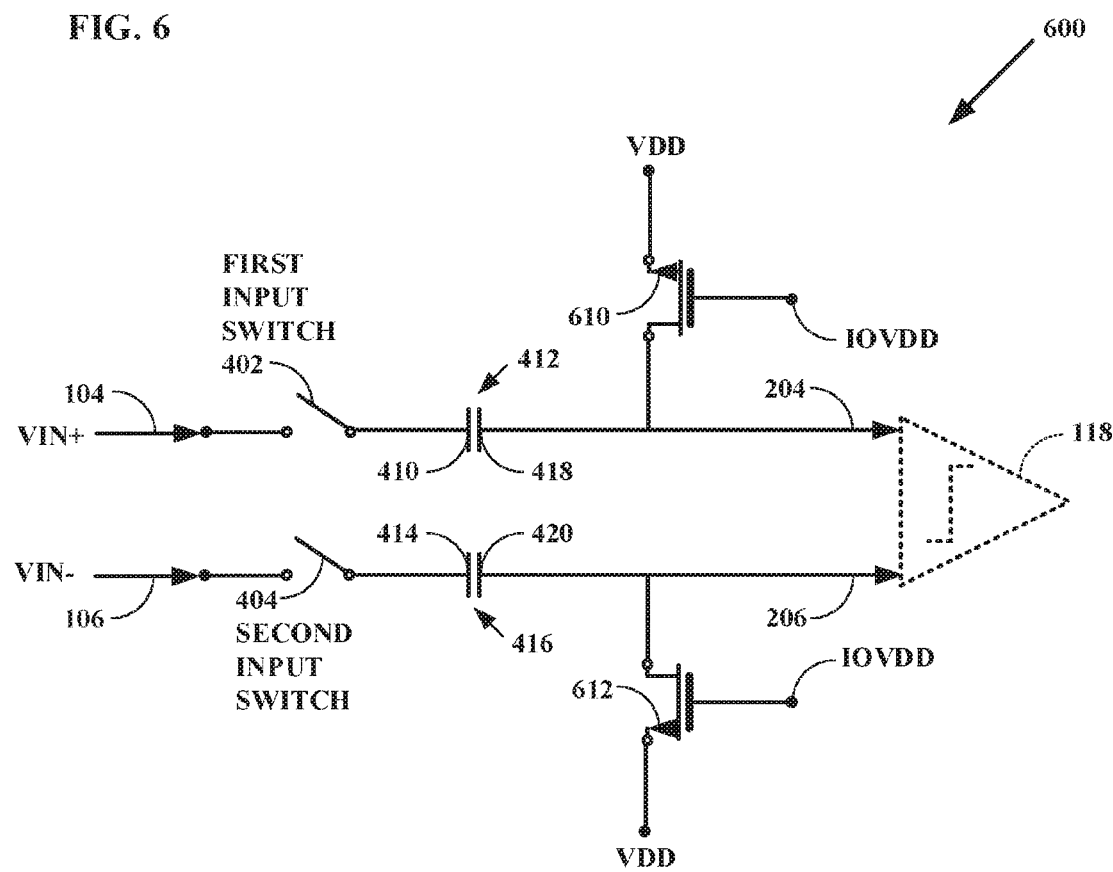
FIG. 6 shows an example of a voltage sampling circuit 600 with reference plate switches using input/output (I/O) devices, such as for analog-to-digital conversion.

FIG. 6 shows an example of a voltage sampling circuit 600 with reference plate switches using input/output (I/O) devices, such as for analog-to-digital conversion. The first reference switch 406 and the second reference switch 408 of FIG. 4 again may not be implemented with regular n-channel field-effect transistors alone due to the potential for transistor leakage currents or damage. Instead, in this example I/O transistors 610 and 612 serve as the reference switches. 1/O transistors used in mixed-signal integrated circuits may have a thicker gate dielectric than other field-effect transistors, as shown, to withstand higher gate voltages than other transistors. I/O devices can operate within a different voltage domain in a given circuit design than the voltage domain of other transistors, e.g., a domain where supply voltages and clock voltages may be higher. An I/O voltage domain clock signal may therefore drive switching transistor gate terminals with a voltage IOVDD that may be higher than VDD. Each reference switch 406 and 408 of FIG. 4 may thus include an I/O type n-channel field-effect transistor that each receives IOVDD as its gate terminal voltage from the clock booster circuit, and VDD as its source terminal voltage. This allows the reference plates 418 and 420 of the capacitors to potentially swing from ground up to IOVDD, without significant leakage or device reliability concerns.

Figure 7:
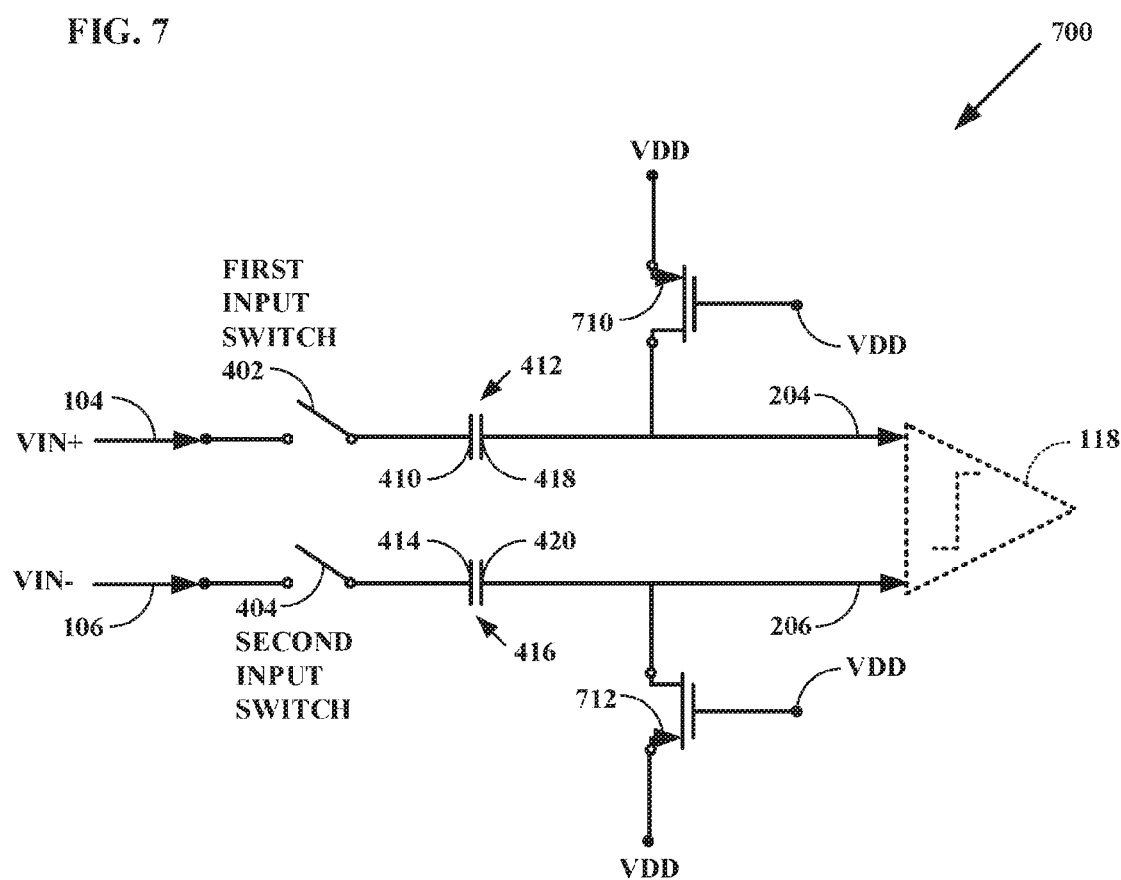
FIG. 7 shows an example of a voltage sampling circuit 700 with reference plate switches using high threshold voltage p-channel devices, such as for analog-to-digital conversion.

FIG. 7 shows an example of a voltage sampling circuit 700 with reference plate switches using high threshold voltage p-channel devices, such as for analog-to-digital conversion. The first reference switch 406 and the second reference switch 408 of FIG. 4 again may not be implemented with regular n-channel field-effect transistors alone due to the potential for transistor leakage currents or damage. Instead, each reference switch 406 and 408 of FIG. 4 may include a high threshold voltage p-channel field-effect transistor (e.g., 710 and 712). Each p-channel field-effect transistor may have a threshold voltage that may be high enough for the p-channel field-effect transistor to remain off, e.g., substantially non-conductive during voltage swings from ground, over VDD, and up to VDD plus the threshold voltage, that is, without significant current leakage beyond typical subthreshold currents typically associated with weak inversion or moderate inversion operation of the p-channel field-effect transistor.

FIG. 8 shows a flowchart of a voltage sampling method 800, such as for analog-to-digital conversion. At 802, the method may include, during a sampling phase, using a first switching circuit, electrically connecting a first reference plate of a first capacitor to a non-zero power supply voltage VDD via a first reference switch. At 804, the method may further include electrically connecting a first input plate of the first capacitor to a first input voltage via a first input switch.

At 806, the method may further include, using a second switching circuit, electrically connecting a second reference plate of a second capacitor to VDD via a second reference switch. At 808, the method may further include electrically connecting a second input plate of the second capacitor to a second input voltage via a second input switch. Operations 802-808 are listed separately, but may occur simultaneously. At 810, during a holding phase, the method may further include holding the voltages sampled on each capacitor. At 812, during a conversion phase, the method may further include performing a data conversion, though this specific application of the voltage sampling method is optional.

The examples provided above each process a differential input signal, e.g., represented by the difference between two separate input voltages, such as on nodes 104 and 106. However, the same principles may also apply more broadly for processing a single-ended input signal, e.g., represented by an input voltage such as at node 104 or node 106, with respect to ground. In each of FIGS. 3-7 for example, one half of each circuit provided may process the single-ended input signal, e.g., the input signal VIN+, as previously described. Likewise, in FIG. 8, the operations regarding a first input voltage may be performed on a single-ended input signal, so the operations regarding a second input voltage that apply to a differential input signal may be omitted.

Each of these non-limiting examples can stand on its own, or can be combined in various permutations or combinations with one or more of the other examples.

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Geometric terms, such as "parallel", "perpendicular", "round", or "square", are not intended to require absolute mathematical precision, unless the context indicates otherwise. Instead, such geometric terms allow for variations due to manufacturing or equivalent functions. For example, if an element is described as "round" or "generally round," a component that is not precisely circular (e.g., one that is slightly oblong or is a many-sided polygon) is still encompassed by this description.

Method examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code may form portions of computer program products. Further, in an example, the code can be tangibly stored on one or more volatile, non-transitory, or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. §1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

The claimed invention is:

1. An integrated circuit for sampling voltages, the integrated circuit comprising:
a number of switching circuits, each of the switching circuits including one or more capacitors and each switching circuit, during a sampling phase, configured to electrically connect a respective reference plate of each of the respective one or more capacitors to a non-zero power supply voltage VDD via a respective reference switch and to electrically connect a respective input plate of each of the respective one or more capacitors to a respective input voltage via a respective input switch, and, during a holding phase, hold a sampled voltage of each of the respective one or more capacitors.

2. The integrated circuit of claim 1 further comprising an electrically coupled comparator circuit that, during a conversion phase after the holding phase, compares a selected combination of sampled voltages and reference voltages, and provides a comparison signal indicating a comparison outcome.

3. The integrated circuit of claim 2 further comprising a successive approximation routine analog-to-digital converter comprising:
a digital-to-analog converter circuit comprising the switching circuits, each switching circuit sampling a respective input voltage to an electrically coupled binary-weighted array of capacitors; and
an electrically coupled successive approximation routine control circuit that, during the conversion phase, selects the reference voltages for the comparator circuit to perform an iterative sequence of bit-wise comparisons, and provides a conversion output signal.

4. The integrated circuit of claim 1 further comprising an operational amplifier that amplifies a number of the held voltages for an electrically coupled pipeline analog-to-digital converter circuit.

5. The integrated circuit of claim 1 wherein at least one of the reference switches comprises an n-channel field effect transistor.

6. The integrated circuit of claim 5 wherein the n-channel field-effect transistor has a gate voltage that is boosted by a clock booster circuit.

7. The integrated circuit of claim 6 wherein a voltage on at least one of the reference plates swings around VDD by up to one of plus and minus VDD.

8. The integrated circuit of claim 5 wherein the n-channel field-effect transistor comprises an I/O device with a gate voltage that is level-shifted by a level shifter circuit to an I/O power supply voltage that is at least equal to VDD.

9. The integrated circuit of claim 8 wherein a voltage on at least one of the reference plates swings between ground and the I/O power supply voltage.

10. The integrated circuit of claim 2 wherein an input pair of the comparator circuit comprises I/O devices.

11. The integrated circuit of claim 1 wherein at least one of the reference switches comprises a p-channel field-effect transistor having a threshold voltage that is high enough for the p-channel field-effect transistor to remain substantially non-conductive during voltage swings between ground and VDD plus the threshold voltage.

12. A method of sampling voltages, comprising:
   using each of a number switching circuits, each switching circuit include one or more capacitors and each switching circuit, during a sampling phase, electrically connecting a respective reference plate of each of the respective one or more capacitors to a non-zero power supply voltage VDD via a respective reference switch and electrically connecting a respective input plate of each of the one or more capacitors to a respective input voltage via a respective input switch; and
   during a holding phase, holding a sampled voltage of each of the respective one or more capacitors.

13. The method of claim 12 further comprising, using an electrically connected comparator circuit, during a conversion phase after the holding phase, comparing selected sampled voltages and selected reference voltages, and providing a comparison signal indicating a comparison outcome.

14. The method of claim 13 further comprising performing a successive approximation routine analog-to-digital conversion by:
   using a digital-to-analog converter circuit comprising the switching circuits, sampling each respective input voltage with each respective switching circuit to an electrically coupled binary-weighted array of capacitors; and
   using an electrically coupled successive approximation routine control circuit, during the conversion phase, providing the references voltages for the comparator circuit to perform a sequence of bit-wise comparisons and to provide a sequence of the comparison signals.

15. The method of claim 12 wherein at least one of the reference switches comprises an n-channel field-effect transistor.

16. The method of claim 15 wherein the n-channel field-effect transistor has a gate voltage that is boosted by a clock booster circuit.

17. The method of claim 16 wherein a voltage on at least one of the reference plates swings around VDD by up to one of plus and minus VDD.

18. The method of claim 12 wherein the n-channel field-effect transistor comprises an I/O device with a gate voltage that is level-shifted by a level shifter circuit to an I/O power supply voltage that is at least equal to VDD.

19. The method of claim 18 wherein a voltage on at least one of the reference plates swings between ground and the I/O power supply voltage.

20. A system, comprising:
   means for sampling and holding a number of input voltages, each measured with respect to a non-zero power supply voltage VDD; and
   means for performing an analog-to-digital data conversion of at least one of (a) one of the input voltages and (b) a difference between two of the input voltages.

* * * * *